US010811065B2

(12) United States Patent
Buchanan et al.

(10) Patent No.: US 10,811,065 B2
(45) Date of Patent: Oct. 20, 2020

(54) READ CIRCUITRY FOR ELECTROSTATIC DISCHARGE SWITCHING MEMRISTIVE ELEMENT

(71) Applicant: Hewlett Packard Enterprise Development LP, Houston, TX (US)

(72) Inventors: Brent Buchanan, Fort Collins, CO (US); Ning Ge, Palo Alto, CA (US); Richard James Auletta, Ft. Collins, CO (US)

(73) Assignee: Hewlett Packard Enterprise Development LP, Houston, TX (US)

( * ) Notice: Subject to any disclaimer, the term of this patent is extended or adjusted under 35 U.S.C. 154(b) by 348 days.

(21) Appl. No.: 15/568,458

(22) PCT Filed: Jun. 5, 2015

(86) PCT No.: PCT/US2015/034539
§ 371 (c)(1),
(2) Date: Oct. 20, 2017

(87) PCT Pub. No.: WO2016/195719
PCT Pub. Date: Dec. 8, 2016

(65) Prior Publication Data
US 2018/0114556 A1    Apr. 26, 2018

(51) Int. Cl.
*G11C 7/24*    (2006.01)
*G11C 29/50*    (2006.01)
(Continued)

(52) U.S. Cl.
CPC .................. *G11C 7/24* (2013.01); *G11C 5/06* (2013.01); *G11C 13/004* (2013.01);
(Continued)

(58) Field of Classification Search
CPC ......... G11C 7/24; G11C 5/06; G11C 13/0007; G11C 13/004; G11C 13/0059;
(Continued)

(56) References Cited

U.S. PATENT DOCUMENTS 5,995,354 A    11/1999  Ta-Lee
8,054,706 B2   11/2011  Goldman et al.
(Continued)

FOREIGN PATENT DOCUMENTS

| CN | 103515381 A | 1/2014 |
| CN | 103580668 A | 2/2014 |
| CN | 104124960 A | 10/2014 |

OTHER PUBLICATIONS

International Searching Authority, The International Search Report and the Written Opinion, dated Mar. 4, 2016, 9 Pages.
(Continued)

*Primary Examiner* — Scott Bauer
(74) *Attorney, Agent, or Firm* — Hewlett Packard Enterprise Patent Department

(57) ABSTRACT

In the examples provided herein, an apparatus has a memristive element coupled to a pin of an integrated circuit, wherein the memristive element switches from a first resistance within a first range of resistance values to a second resistance within a second range of resistance values in response to an electrostatic discharge (ESD) event at the pin. The apparatus also has read circuitry coupled to the memristive element to determine whether a resistance of the memristive element is in the first or second range of resistance values, wherein the read circuitry includes a first transistor. Further, the coupling between the read circuitry and the memristive element does not include a direct path for current from the ESD event to a gate terminal of the first transistor.

14 Claims, 12 Drawing Sheets

(51) Int. Cl.
  *G11C 13/00* (2006.01)
  *G11C 5/06* (2006.01)
  *H02H 1/00* (2006.01)
  *H02H 9/04* (2006.01)
(52) U.S. Cl.
  CPC ...... *G11C 13/0007* (2013.01); *G11C 13/0059* (2013.01); *G11C 13/0069* (2013.01); *G11C 13/0097* (2013.01); *G11C 29/50* (2013.01); *H02H 1/0061* (2013.01); *H02H 9/046* (2013.01); *G11C 2013/0045* (2013.01); *G11C 2013/0054* (2013.01); *G11C 2013/0078* (2013.01); *G11C 2029/5002* (2013.01)
(58) Field of Classification Search
  CPC . G11C 13/0069; G11C 13/0097; G11C 29/50; H02H 1/0061; H02H 9/046
  USPC ........................................................ 361/56
  See application file for complete search history.

(56) References Cited

U.S. PATENT DOCUMENTS

| | | | | |
|---|---|---|---|---|
| 8,264,233 | B2* | 9/2012 | Wallash | G01R 31/001 |
| | | | | 324/452 |
| 8,462,457 | B1 | 6/2013 | Sutardja | |
| 9,172,241 | B2* | 10/2015 | Chen | H02H 9/046 |
| 9,299,425 | B2* | 3/2016 | Mohammad | G11C 13/0002 |
| 2002/0064007 | A1 | 5/2002 | Chang et al. | |
| 2007/0159787 | A1 | 7/2007 | Alaimo et al. | |
| 2008/0145958 | A1* | 6/2008 | Abou-Khalil | H01L 22/14 |
| | | | | 438/18 |
| 2009/0289636 | A1 | 11/2009 | Hernandez | |
| 2010/0225347 | A1 | 9/2010 | Worley et al. | |
| 2011/0025339 | A1 | 2/2011 | Wallash | |
| 2012/0106011 | A1 | 5/2012 | Lee et al. | |
| 2013/0200488 | A1 | 8/2013 | Chung | |
| 2013/0257624 | A1 | 10/2013 | Ayotte et al. | |
| 2013/0258533 | A1 | 10/2013 | Chen | |
| 2014/0191778 | A1 | 7/2014 | DeForge et al. | |
| 2014/0369108 | A1 | 12/2014 | Mohammad et al. | |
| 2016/0020766 | A1* | 1/2016 | Miao | H03K 19/0002 |
| | | | | 326/37 |

OTHER PUBLICATIONS

Yen, C.-C., et al., System-level ESD Protection Design with On-chip Transient Detection Circuit, May 17, 2006, IEEE, pp. 616-619.
Elmer, G., et al; "Possible application of memrisiors in ESD protection". Journal of Electrostatics. Elsevier Science Publishers B.V. Amsterdam, NL, vol. 71, No. 3, Nov. 30, 2012. pp. 373-376. XP028525039. ISSN: 0304-3886. DOI: 10.1016/J.ELSTAT.2012.11.008.
Huang et al, "ESD Avoiding Circuits for Solving OTP Memory Falsely Programmed Issues", IEEE Circuits and Systems Magazine, IEEE Service Center, New York, NY, US, vol. 10, No. 2, Apr. 1, 2010, pp. 30-39.
European Search Report and Search Opinion Received for EP Patent Application No. 15894481.9, dated May 28, 2018, 4 pages.
Partial European Search Report and Search Opinion Received for EP Patent Application No. 15894481.9, dated Feb. 2, 2018, 15 pages.

* cited by examiner

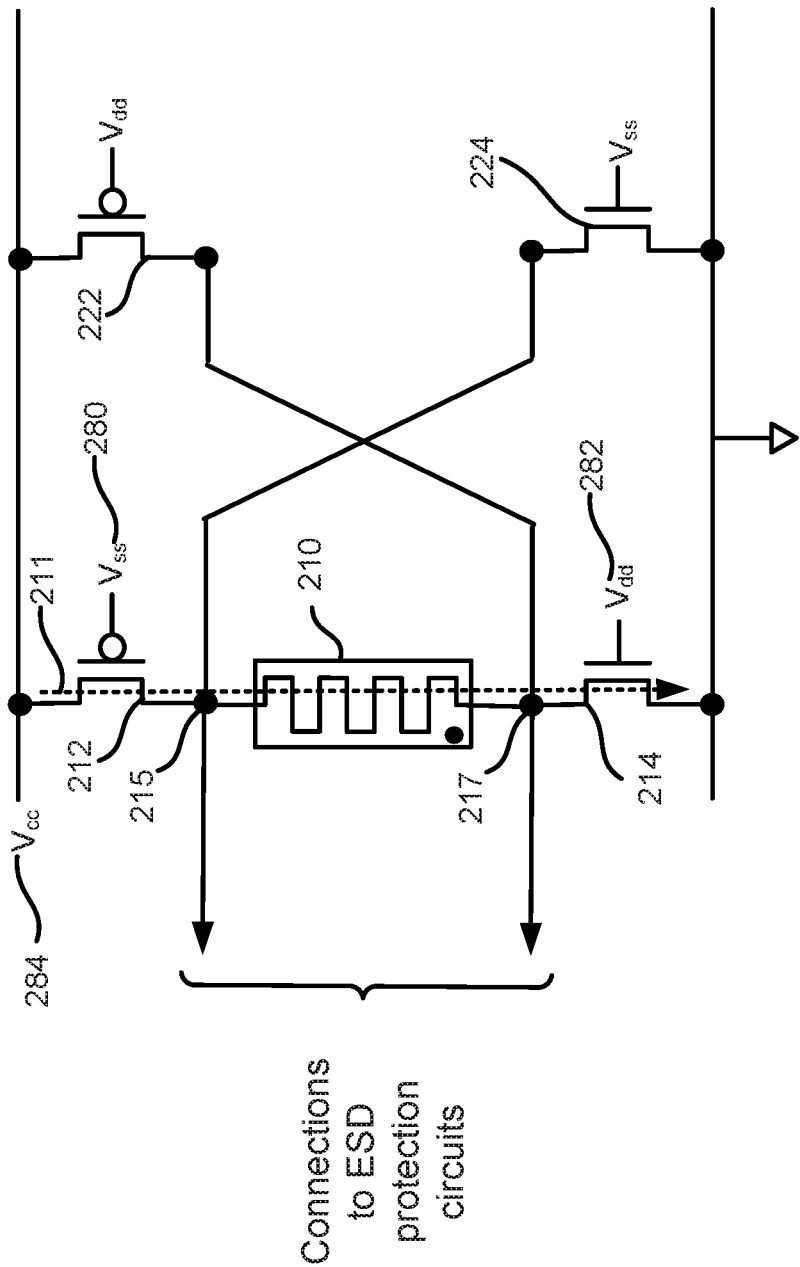

1000

Reset a first resistance of a memristive element coupled to a pin on a first chip to a resistance in a second range of resistance values
1005

Serially reset subsequent resistances of other memristive elements coupled to respective pins on the first chip to a resistance in the second range of resistance values
1010

Serially reset each memristive element coupled to a respective pin of a second chip to a resistance in the second range of resistance values
1015

*FIG. 10*

READ CIRCUITRY FOR ELECTROSTATIC DISCHARGE SWITCHING MEMRISTIVE ELEMENT

BACKGROUND

An integrated circuit (IC) is a group of miniaturized electronic components fabricated on a substrate of semiconductor material, such as silicon. An IC can be microscopic in size. In fact, an IC the size of a dime can have billions of transistors and other types of electronic components.

Electrostatic discharge (ESD) can damage or destroy components of an IC. ESD occurs when an accumulated electric charge is shorted to a lower potential. There are many situations in which an ESD event can arise for an IC, for example, when a charged body touches the IC and when a charged IC touches a grounded element. When the electric charge moves between surfaces, it becomes a current that can damage the IC.

BRIEF DESCRIPTION OF THE DRAWINGS

The accompanying drawings illustrate various examples of the principles described below. The examples and drawings are illustrative rather than limiting.

FIGS. 2A-2B depict example circuitry for resetting and setting a resistance of a memristive element that records an ESD event.

FIG. 10 depicts a flow diagram illustrating an example process of resetting multiple memristive elements that record ESD events on multiple chips.

DETAILED DESCRIPTION

Described below are examples of circuitry that may be used to read and/or write the resistance of a memristive element that records the occurrence of an ESD event at the pin of an integrated circuit (IC). The current from an ESD event recorded by the memristive element should not have a direct path to a gate oxide of a gate terminal of a transistor in the read circuitry and/or write circuitry, rather the current from the ESD event should be directed to a dopant diffusion region of a source terminal or a drain terminal of a transistor in the read and/or write circuitry to prevent damage to the circuitry.

Electrostatic discharge (ESD) may occur without warning and may arise in manufacturing and operating environments. ESD protection circuits have been developed to shunt ESD currents away from circuits in an IC that would otherwise be damaged by the discharge. However, ESD protection circuits may not be totally reliable because they may turn on too late, trigger at a voltage that is too high to protect the IC, or fail during the occurrence of an ESD. Further, a single ESD pulse may be insufficiently strong to damage the IC, as determined through functional testing of the IC. But if the IC is subjected to multiple weak ESD pulses, the IC may be degraded more with each pulse, ultimately resulting in catastrophic failure. It would be beneficial to know when an IC has experienced an ESD event, independent of whether the ESD event was strong enough to cause immediately measurable damage. One way to do so is to use at least one memristive element at each pin of an IC to record the occurrence of an ESD event. This technique may be applied to any type of IC.

A memristive element may switch between two or more states, for example, a low resistance state (LRS) and a high resistance state (HRS). With a bipolar memristive element, when voltage is applied to the element in one direction, the element may be set to the LRS, and when voltage is applied to the element in the opposite direction, the element may be set to the HRS. With a unipolar memristive element, along with the application of a compliance current, when voltage of a first magnitude is applied to the element, the element may be set to the LRS, and when voltage of a second, different magnitude is applied to the element in the same direction, the element may be set to the HRS. In both cases, the memristive element may remain in one state, for example, the HRS, until subsequent switching to the other state, for example, the LRS, is triggered by the application of a switching voltage or current to the memristive element. Thus, by coupling a memristive element to each pin of an IC, the memristive elements may be able to record the occurrence of an ESD event at each pin, respectively.

Figure 1A:
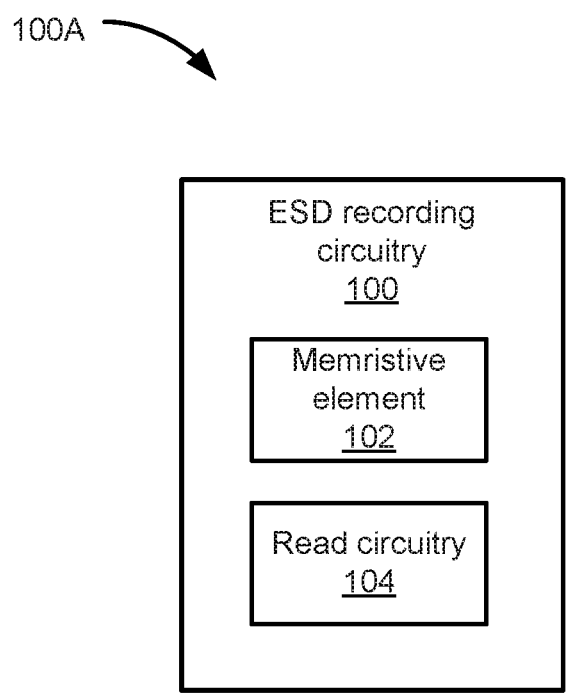
FIGS. 1A-1B depict block diagrams of example electrostatic discharge recording circuitry including a memristive element for detecting an electrostatic discharge (ESD) event and reading circuitry for determining whether an ESD event occurred.

FIG. 1A depicts a block diagram of an example electrostatic discharge recording circuitry 100A including a memristive element 102. The memristive element 102 of FIG. 1 may be coupled to a pin of an integrated circuit (IC) and used to detect and record the occurrence of an electrostatic discharge (ESD) event at the pin. The memristive element 102 may be initially set to a first resistance within a first range of resistance values prior to being used to detect an ESD event. Then when an ESD event occurs at the pin of the IC, the memristive element 102 allows current to pass through and absorbs the energy of the ESD event. When the voltage of the ESD event is large enough to trigger the memristive element 102 to switch resistance states, the memristive element 102 switches to a second resistance within a second range of resistance values. In some implementations, the first range of resistance values may be less than the second range of resistance values.

The example circuitry 100 of FIG. 1A also includes read circuitry 104 to determine whether a resistance of the memristive element 102 is in the first or second range of resistance values. For example, the read circuitry 104 may be used to determine whether the memristive element 102 is in the LRS in the first range of resistance values or the HRS in the second range of resistance values. If the memristive element 102 is initially placed in the LRS, and the read circuitry 104 determines that the memristive element 102 is in the HRS, or if the memristive element 102 is initially placed in the HRS, and the read circuitry 104 determines that the memristive element 102 is in the LRS, the change in resistance state indicates that an ESD event occurred at the pin of the IC to which the memristive element 102 is coupled. In some implementations, the read circuitry 104 includes a first transistor, and the coupling between the read circuitry 104 and the memristive element 102 should not include a direct path for current from the ESD event to a gate terminal of the first transistor because the gate oxide is thin and may be readily damaged by the ESD. In some implementations, the coupling between the read circuitry and the memristive element includes a direct path for current from the ESD to a dopant diffusion region of the first transistor, such as found at the source terminal or the drain terminal.

Figure 1B:
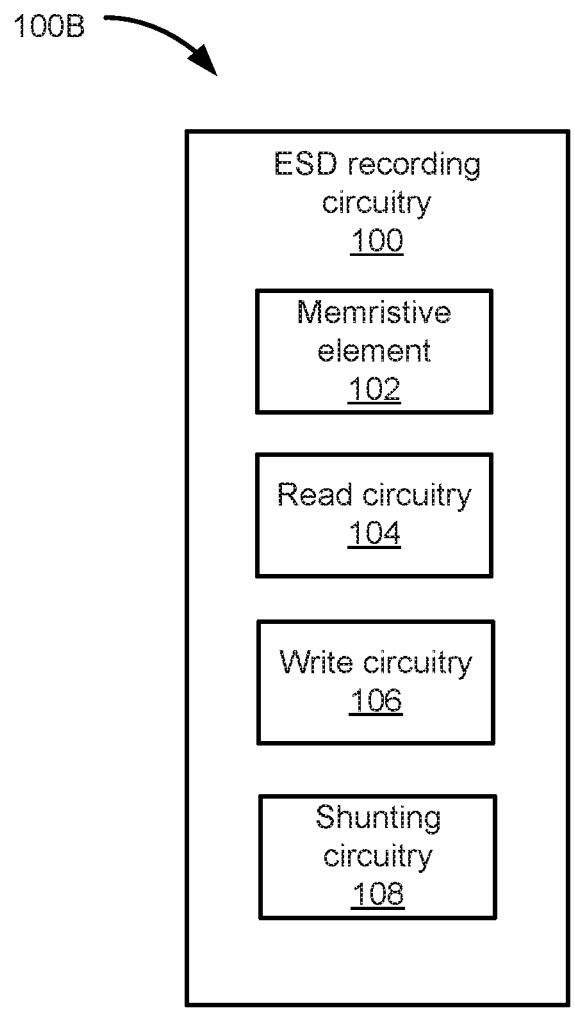

FIG. 1B depicts a block diagram of an example electrostatic discharge recording circuitry 100E including the memristive element 102, the read circuitry 104, write circuitry 106, and shunting circuitry 108. The shunting circuitry 108 may shunt energy away from the memristive element 102 after the memristive element 102 switches from a first resistance to a second resistance. For example, after the memristive element 102 has switched to a higher second resistance in response to an ESD event, the memristive element 102 no longer allows as much current to pass through, thus most of the current is shunted away from the memristive element 102 by the shunting circuitry 108. If the memristive element 102 is not actively set to the first resistance by the application of a switching voltage, the memristive element 102 remains at the second resistance after the ESD event occurs. As a result, the resistance of the memristive element 102 may be read to determine whether the memristive element 102 coupled to the pin of the IC experienced an ESD event. For example, if the resistance of the memristive element 102 is determined to remain at the originally set first resistance, it may be concluded that no ESD event has occurred. However, if the resistance of the memristive element 102 is determined to be the second resistance, this is an indication that the memristive element 102 has experienced an ESD event, and thus, the circuitry of the IC has been exposed to the ESD event. As discussed above, the read circuitry 104 may be used to determine the resistance of the memristive element 102.

The shunting circuitry 108 may also shunt energy from an additional, subsequent ESD event after the first ESD has occurred away from the memristive element 102 because the memristive element 102 has, for example, switched to the second higher resistance and passes very little current. In some examples, the shunting circuitry 108 may include a first resistive element in parallel with the memristive element 102 that has a third resistance greater than the first resistance and less than the second resistance. Further, the resistance of the memristive element 102 may be maintained at the second resistance after switching from the first resistance until the resistance is again set to the first resistance.

Additionally, an impedance of the read circuitry 104 and/or the write circuitry 106 may be greater than an impedance of the shunting circuitry 108 so that current from an ESD is directed toward the shunting circuitry 108, rather than to the read circuitry 104 or the write circuitry 106.

In some instances, once the memristive element 102 has been read and determined to be the second resistance, write circuitry 106 may be used to change the resistance of the memristive element 102 to the first resistance again by applying a voltage to the memristive element 102. In the case of bipolar memristive elements, voltage of one polarity may be used to set the memristive element, for example, to a LRS, and voltage of the opposite polarity may be used to reset the memristive element, for example, to a HRS. In the case of unipolar memristive elements, voltage of the same polarity may be used to set and reset the memristive element.

In some implementations, the write circuitry 106 may include a second transistor, and the coupling between the write circuitry 106 and the memristive element 102 should not include a direct path for current from the ESD event to a gate terminal of the second transistor because the gate oxide is thin and can be readily damaged by the ESD. In some implementations, the coupling between the write circuitry 106 and the memristive element 102 includes a direct path for current from the ESD to a dopant diffusion region of the second transistor, such as found at the source terminal or the drain terminal.

Because the occurrence of an ESD event at any of the pins of an IC may be deleterious to the IC, the IC should be tested prior to returning the polarity of the memristive element 102 to the first resistance. Further, as testing may not show an immediate indication of damage, the lifetime of the IC may be shortened by the occurrence of the ESD event, and it may be appropriate to discard the IC or take other measures, such as binning the ICs based on the number of ESD events recorded for the IC.

Figure 2B:
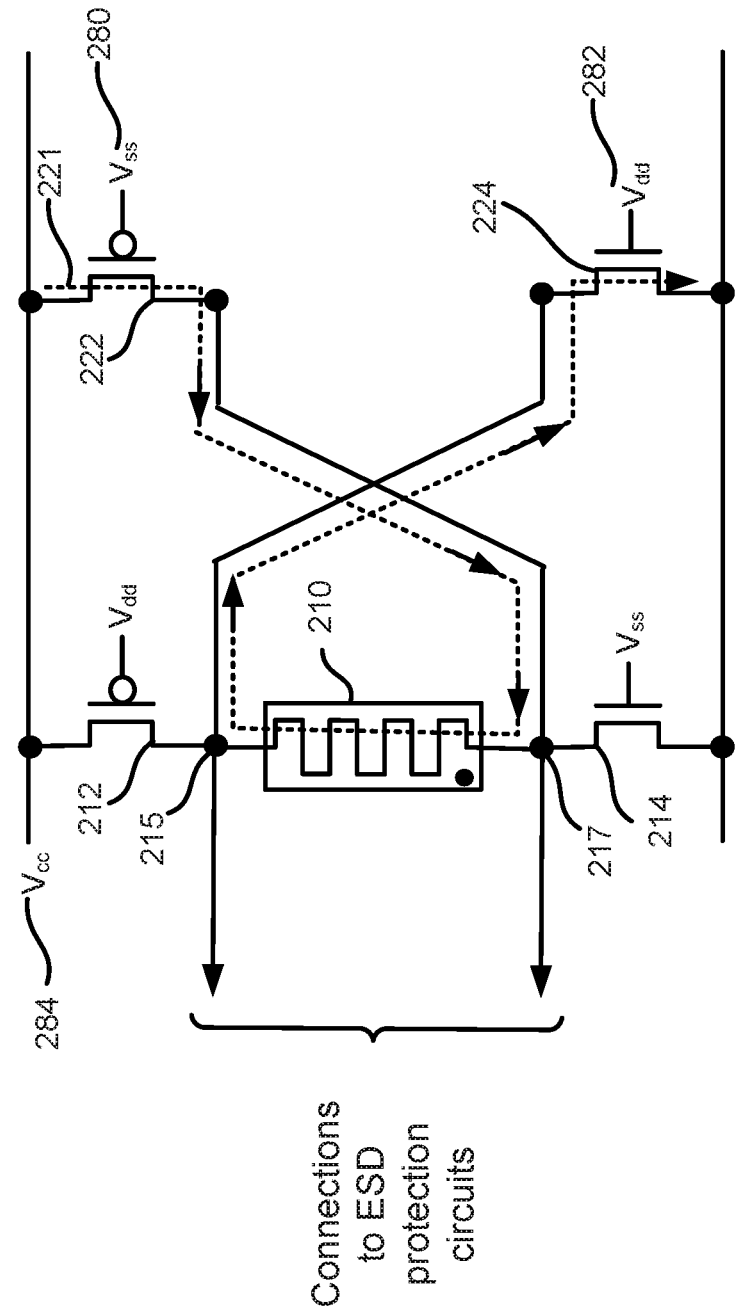

FIGS. 2A-2B depict examples of write circuitry for resetting and setting a resistance of a memristive element 210 used to record an ESD event. ESD protection circuits may be coupled to nodes 215, 217 of the write circuitry shown in FIGS. 2A-2B.

In FIG. 2A, the dotted line indicates the current path 211 in the write circuitry that may be used for resetting a memristive element 210 to a LRS from a HRS. In the current path 211, transistors 212, 214 are turned on, while transistors 222, 224 are turned off. For example, a voltage Vss may be applied to the gate terminal of a p-type metal-oxide-semiconductor (PMOS) 212, and a voltage Vdd may be applied to the gate terminal of an n-type metal-oxide-semiconductor (NMOS) 214. As a result, a positive polarity is applied on the cathode side of the memristive element 210 (the side of the memristive element 210 coupled to node 215) to bias and reset the memristive element 210 to the LRS. Note that for the write circuitry shown in FIG. 2A, the memristive element 210 is coupled to the doped diffusion regions of the drain terminals of transistors 212, 214, rather than to the thin gate oxide region of the gate terminal of either transistor 212, 214. The diffusion regions of the transistors 212, 214 are better able to absorb the high voltages of an ESD event than the thin gate oxide region of the gate terminal of transistors 212, 214.

Along the write circuitry of the current path 211 shown in FIG. 2A, the memristive element 210 has a first memristive terminal coupled to node 215 and a second memristive terminal coupled to node 217. The write circuitry includes a first write reset transistor 212 having a first reset gate terminal, a first reset source terminal, and a first reset drain terminal; and a second write reset transistor 214 having a second reset gate terminal, a second reset source terminal, and a second reset drain terminal. The first reset gate terminal is coupled to a first voltage source 280, and the second reset gate terminal is coupled to a second voltage source 282. The first memristive terminal is coupled to a first reset drain terminal of first write reset transistor 212, and the second memristive terminal is coupled to a second reset drain terminal of the second write reset transistor 214. Further, the first reset source terminal is coupled to a third voltage source 284, and the second reset source terminal is coupled to ground. When the write circuitry is used to reset the resistance of the memristive element 210, current flows from the third voltage source 284 to the first reset source terminal, through the first write reset transistor 212 to the first memristive terminal, through the memristive element 210 to the second memristive terminal, through the second write reset transistor 214 to the second reset source terminal of the second write reset transistor 214 coupled to ground.

In FIG. 2B, the dotted line indicates the current path 221 in the write circuitry that may be used for setting a memristive element 210 to a HRS from a LRS. In the current path 221, transistors 222, 224 are turned on, while transistors 212, 214 are turned off. For example, a voltage Vss is applied to the gate terminal of PMOS 222, and a voltage Vdd is applied to the gate terminal of NMOS 224. As a result, a positive polarity is applied on the anode side of the memristive element 210 (the side coupled to node 217), to bias and set the memristive element 210 to the HRS. Note that for the write circuitry shown in FIG. 2B, the memristive element 210 is coupled to the doped diffusion regions of the drain terminals of transistors 222, 224. The diffusion regions of the transistors 222, 224 are better able to absorb the high voltages of an ESD event than the thin gate oxide region of the gate terminal of transistors 222, 224.

Along the write circuitry of the current path 221 shown in FIG. 2B, the memristive element 210 has a first memristive terminal coupled to node 215 and a second memristive terminal coupled to node 217. The write circuitry includes a first write set transistor 222 having a first set gate terminal, a first set source terminal, and a first set drain terminal; and a second write set transistor 224 having a second set gate terminal, a second set source terminal, and a second set drain terminal. The first set gate terminal is coupled to the first voltage source 280, and the second set gate terminal is coupled to the second voltage source 282. The second memristive terminal is coupled to a first set drain terminal of the first write set transistor 222, and the first memristive terminal is coupled to a second set drain terminal of the second write set transistor 224. Further, the first set source terminal is coupled to a third voltage source 284, and the second set source terminal is coupled to ground. When the write circuitry is used to set the resistance of the memristive element 210, current flows from the third voltage source 284 to the first set source terminal, through the first write set transistor 222 to the second memristive terminal, through the memristive element 210 to the first memristive terminal, through the second write set transistor 224 to the second set source terminal of the second write set transistor 224 coupled to ground.

Figure 3:
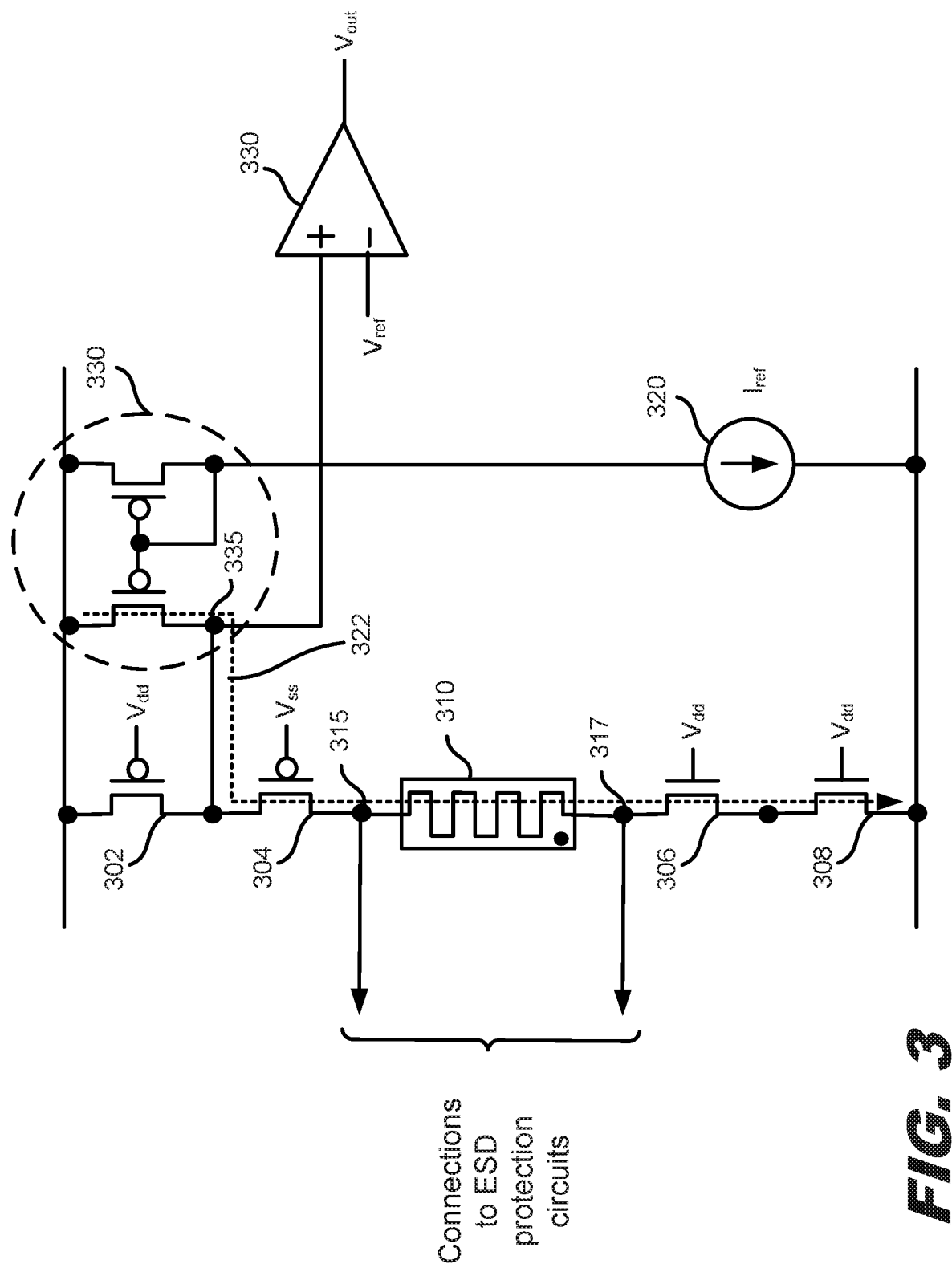
FIG. 3 depicts example circuitry for reading a memristive element that records whether an ESD event occurred.

FIG. 3 depicts example read circuitry for determining a resistance of a memristive element 310 used to record whether an ESD event occurred. ESD protection circuits may be coupled to nodes 315, 317 of the read circuitry shown in FIG. 3.

The current mirror 330 replicates the reference current ref generated by current source 320. The replicated current follows current path 322 as indicated by the dotted line. The known replicated current is passed through memristive element 310 which has a resistance R. Thus, the voltage drop across the memristive element 310 is given by $I_{ref}*R$. The voltage across the memristive element 310 is linear with current and linear with resistance, and because a constant known current $I_{ref}$ is used, the resistance of the memristive element 310 causes a change in the voltage at node 335. If the resistance is high, the voltage at node 335 is high, and if the resistance is low, the voltage at node 335 is low.

Voltage comparator 330 compares the voltage drop across the memristive element 310 to a reference voltage $V_{ref}$ to determine whether the voltage at node 335 is above or below reference voltage $V_{ref}$. If the voltage at node 335 is above the reference voltage $V_{ref}$, $V_{out}$ is positive, and if the voltage at node 335 is below the reference voltage $V_{ref}$, $V_{out}$ is negative. Thus, the sign of the output voltage $V_{out}$ is based on the voltage drop across the memristive element 310 relative to the reference voltage, and $V_{out}$ may be used to determine whether the resistance of the memristive element is in the first range of resistance values or the second range of resistance values. Note that for the read circuitry shown in FIG. 3, the memristive element 310 is coupled to the doped diffusion regions of the drain terminals of transistors 304, 306, rather than the thin gate oxide region of the gate terminal of transistors 304, 306.

Figure 4:
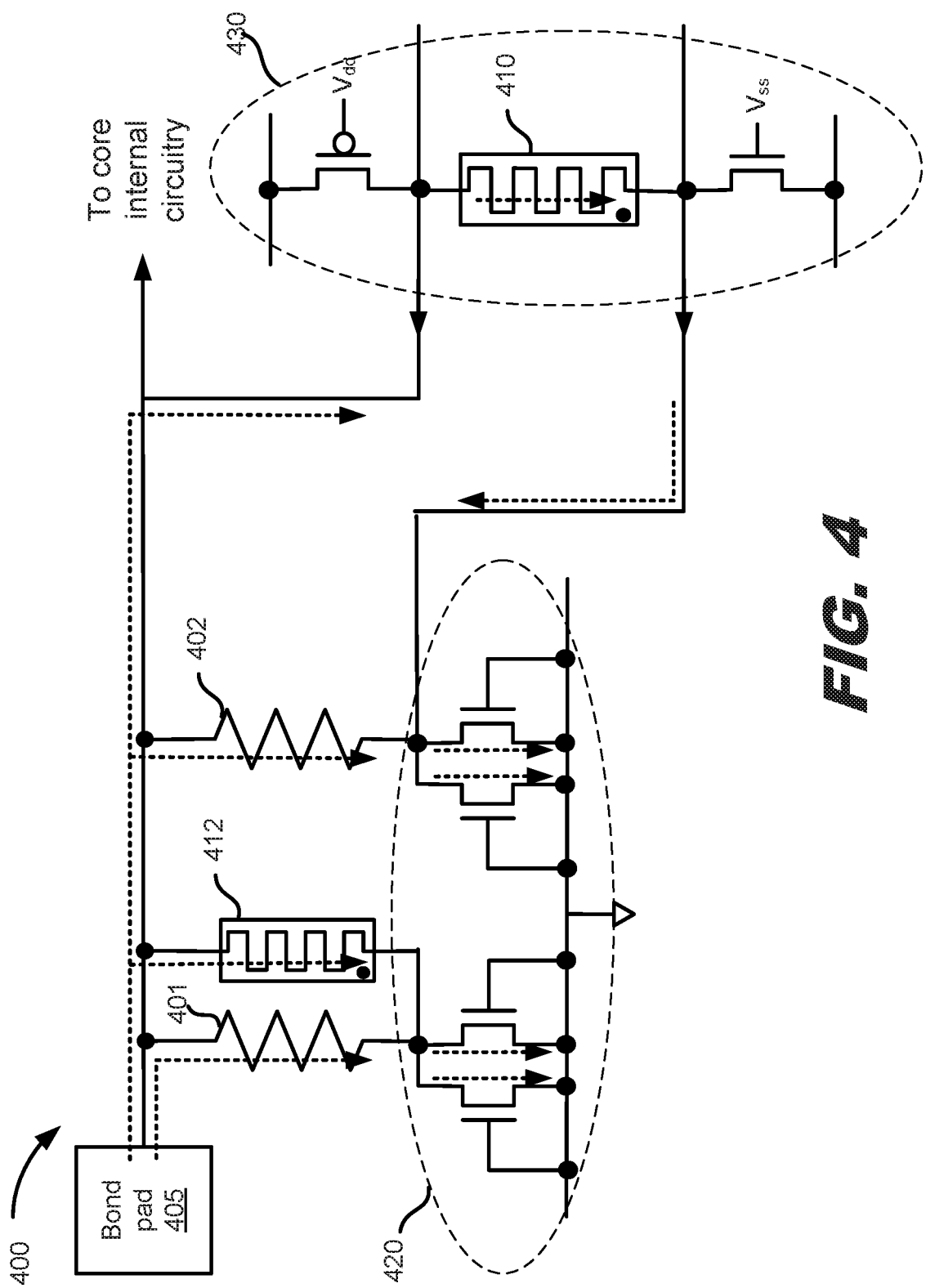
FIG. 4 depicts example circuitry that includes ESD protection circuitry and read/write circuitry.

FIG. 4 depicts example ESD protection circuitry that includes memristive elements 410, 412 for detecting an ESD event, and read/write circuitry 430. The memristive elements 410, 412 are coupled to a pin of an IC via bond pad 405, where the chip pin may be wire-bonded to the bond pad 405. The memristive elements 410, 412 may switch from a first resistance within a first range of resistance values to a second resistance within a second range of resistance values when an ESD event occurs at the pin, where the first range of resistance values is less than the second range of resistance values. The circuitry 400 also includes shunting circuitry to shunt energy away from the memristive elements 410, 412, where the shunting circuitry includes resistors 410, 402 and grounded-gate transistors 420.

The dotted lines in FIG. 4 show the current paths for an ESD event that occurs at the IC pin coupled to the bond pad 405. The current paths go through resistors 401, 402, through memristive elements 410, 412, and through the grounded-gate transistors of the shunting circuitry 420. The read/write circuitry 430 shown in the example of FIG. 4 is a non-limiting example of circuitry and may have any configuration, such as, for example, shown in FIGS. 2A, 2B, and 3.

Figure 5:
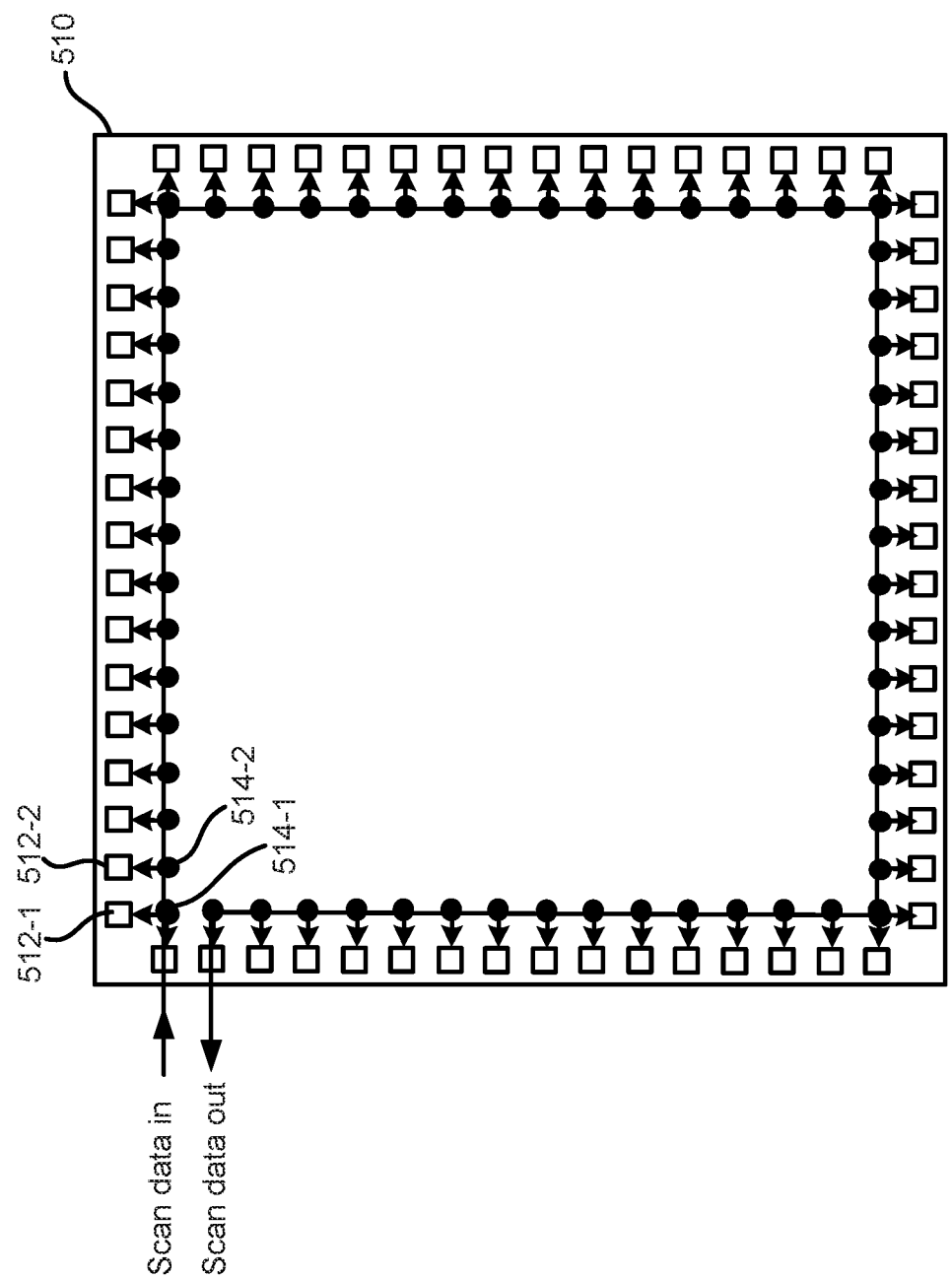
FIG. 5 depicts an example chip with multiple memristive elements coupled to corresponding pins on the chip that may be serially scanned for recorded ESD events.

FIG. 5 depicts an example chip 510 with multiple memristive elements with read/write circuitry 514 coupled to corresponding bond pads 512 on the chip 510 that may be serially scanned for recorded ESD events. In some implementations, the chip may be placed in a test mode distinct from a use mode. The test mode may be used, for example, during production and/or assembly test to determine whether an ESD event has occurred at any of the pins of the chip 510, resulting in adverse effects on the circuitry of the chip 510. A serial test protocol, such as JTAG (Joint Test Action Group) may be used to serially scan each of the memristive elements via the corresponding the read circuitry 514 to query the memristive elements on the chip 510. For example, a LRS corresponding to a memristive element may indicate that no ESD occurred at the corresponding pin, while a HRS may indicate that an ESD event has occurred. Similarly, the serial test protocol may be used to set and/or reset the resistance of the memristive elements on the chip 510 via the write circuitry 514.

Figure 6:
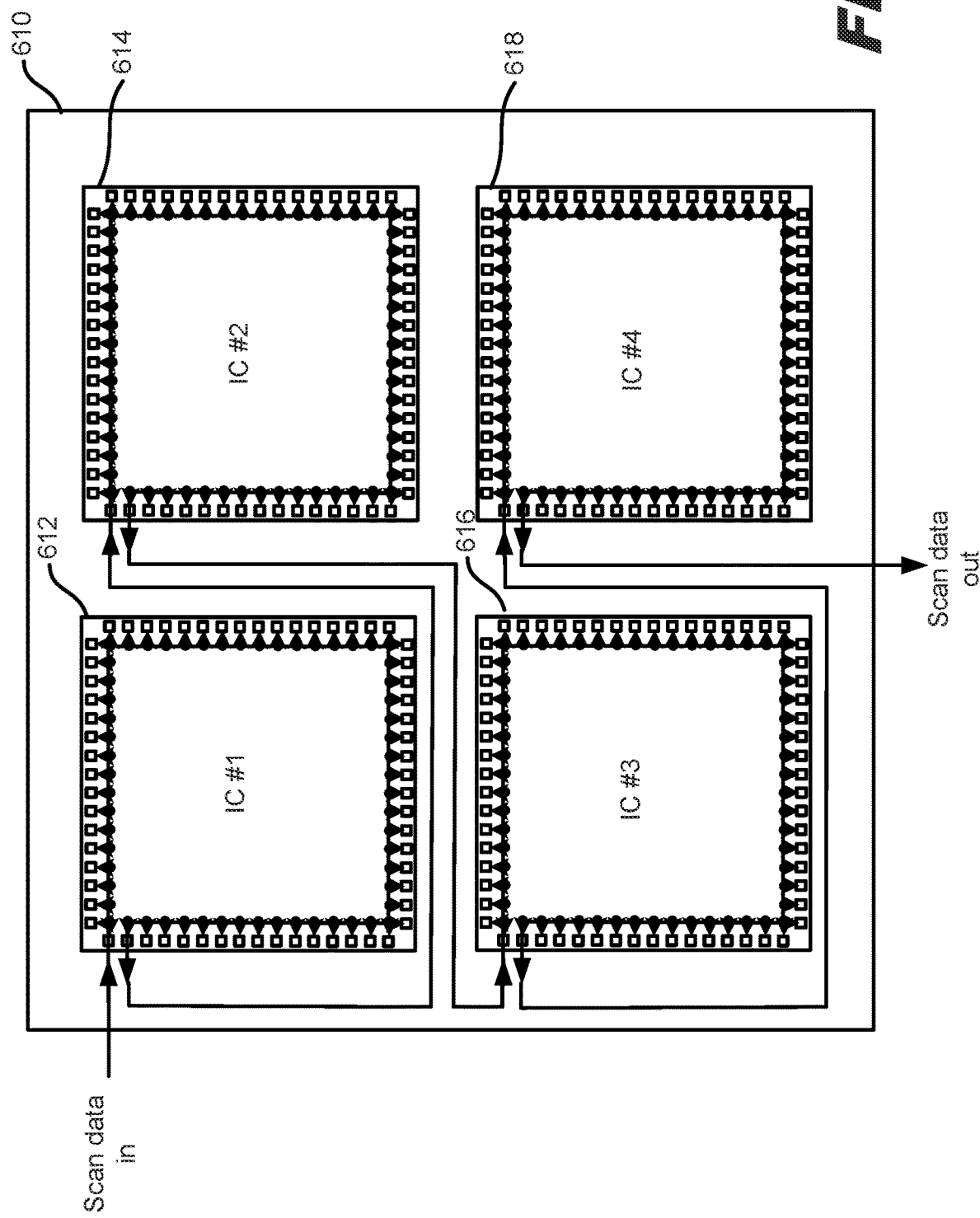
FIG. 6 depicts an example board having multiple chips, and each chip having multiple memristive elements, where the memristive elements may be serially scanned on the board for recorded ESD events.

FIG. 6 depicts an example board 610 having multiple chips 612, 614, 616, 618, and each chip 612, 614, 616, 618 has multiple memristive elements with read/write circuitry, where the memristive elements may be serially scanned on the board 610 for recorded ESD events. As with scanning memristive elements on a single chip, a serial test protocol, may be used to serially scan each of the memristive elements via the corresponding read circuitry to query the memristive elements on the board 610. The serial scan may sequentially scan the read circuitry of chips 612, 614, 616, 618 on the board 610, or any subset thereof. Similarly, the serial test protocol may be used to sequentially set and/or reset the resistance of the memristive elements on the chips 612, 614, 616, 618 via the corresponding write circuitry.

Figure 7:
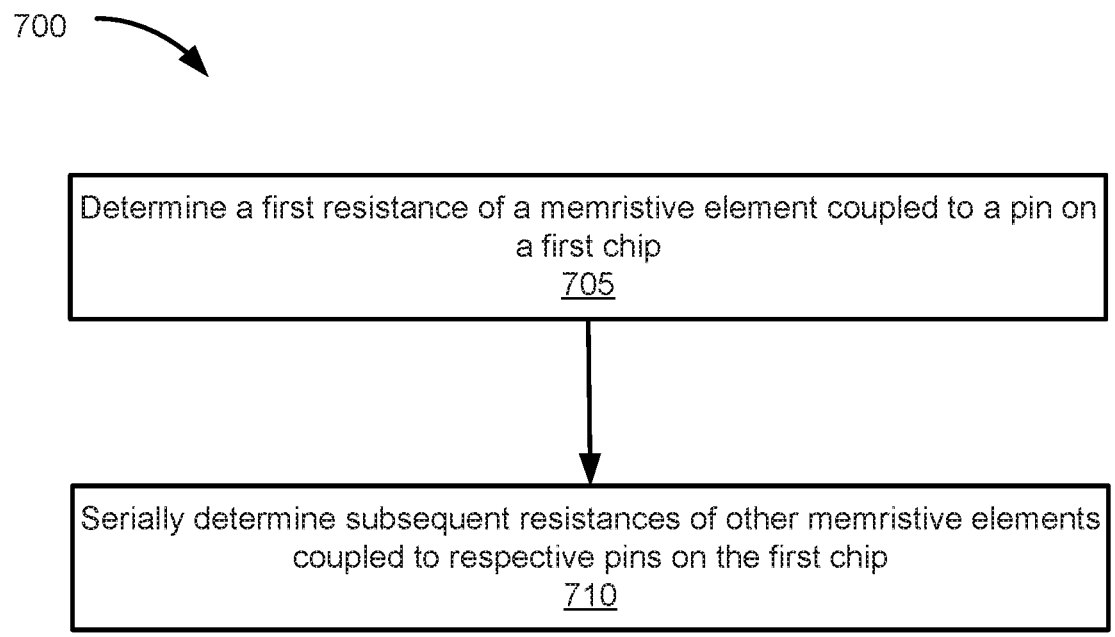
FIG. 7 depicts a flow diagram illustrating an example process of reading multiple memristive elements that record ESD events on a chip.

FIG. 7 depicts a flow diagram illustrating an example process 700 of determining multiple memristive elements that record ESD events on a chip.

At block 705, a first resistance of a memristive element coupled to a pin on a first chip may be determined. The resistance of the memristive element may be determined by querying read circuitry coupled to the memristive element. For example, the read circuitry may provide information whether a voltage drop across the memristive element is greater than or less than a reference voltage. Based on this information, it may be determined whether the resistance of the memristive element is in a first range of resistance values or a second range of resistance values.

At block 710, subsequent resistances of other memristive elements coupled to respective pins on the first chip may be serially determined. Each memristive element may switch from a first resistance within a first range of resistance values to a second resistance within a second range of resistance values in response to an electrostatic discharge (ESD) event at the respective pins.

In some implementations, determining the first resistance of the memristive element and serially determining subsequent resistances of other memristive elements may be performed using a serial test protocol, for example, JTAG.

In some implementations, a resistance of each memristive element may be set to a resistance within the first range of resistance values if the resistance of a given memristive element is within the second range of resistance values.

Figure 8:
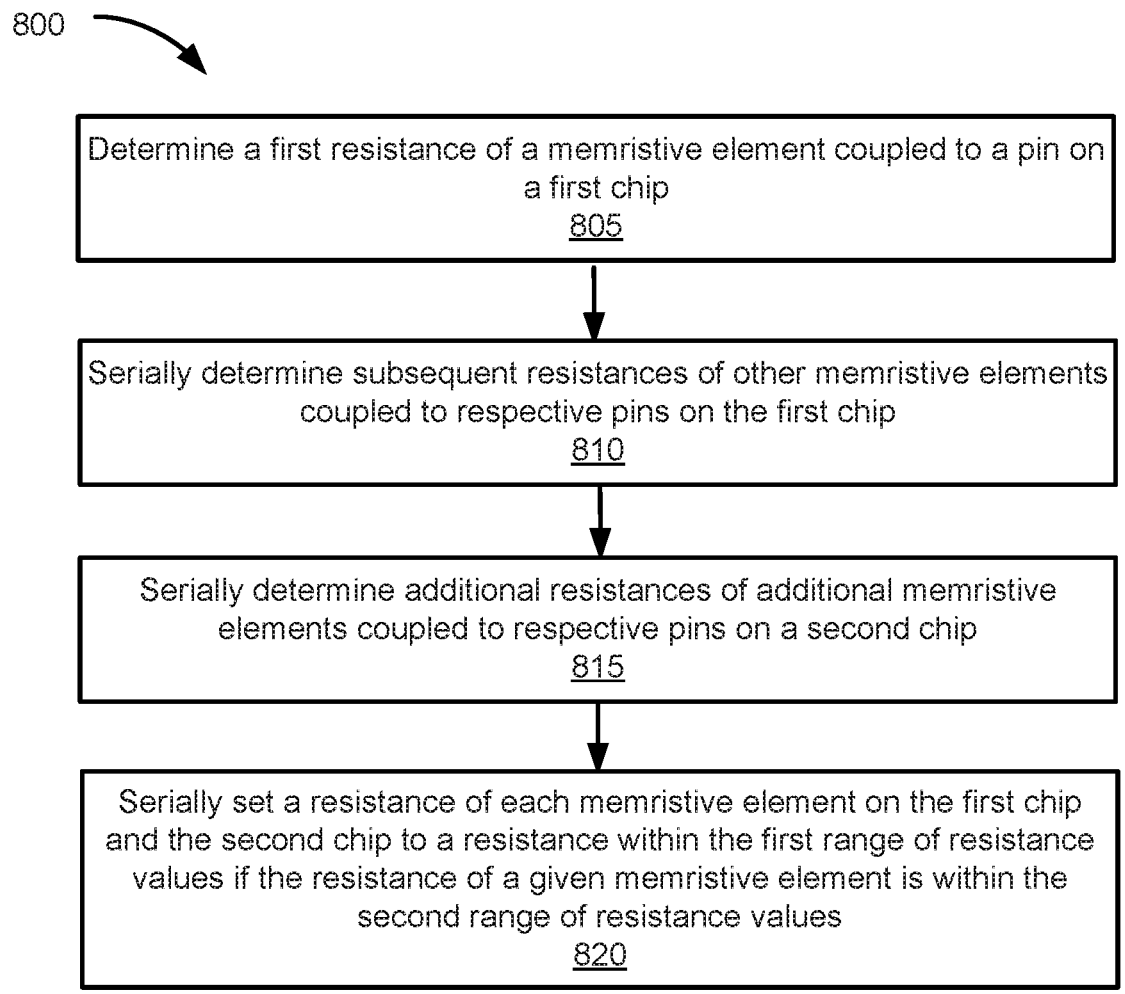
FIG. 8 depicts a flow diagram illustrating an example process of reading and setting multiple memristive elements that record ESD events on multiple chips.

FIG. 8 depicts a flow diagram illustrating an example process 800 of determining and setting multiple memristive elements that record ESD events on multiple chips. The process begins at block 805 which may be similar to block 705 described with respect to the process 700 of FIG. 7. Block 810 may also be similar to block 710 of FIG. 7.

At block 815, additional resistances of additional memristive elements coupled to respective pins on a second chip, distinct from the first chip, may be serially determined. In some implementations, the first chip and the second chip may be on the same board.

At block 820, a resistance of each memristive element on the first chip and the second chip may be set to a resistance within the first range of resistance values if the resistance of a given memristive element is within the second range of resistance values.

Figure 9:
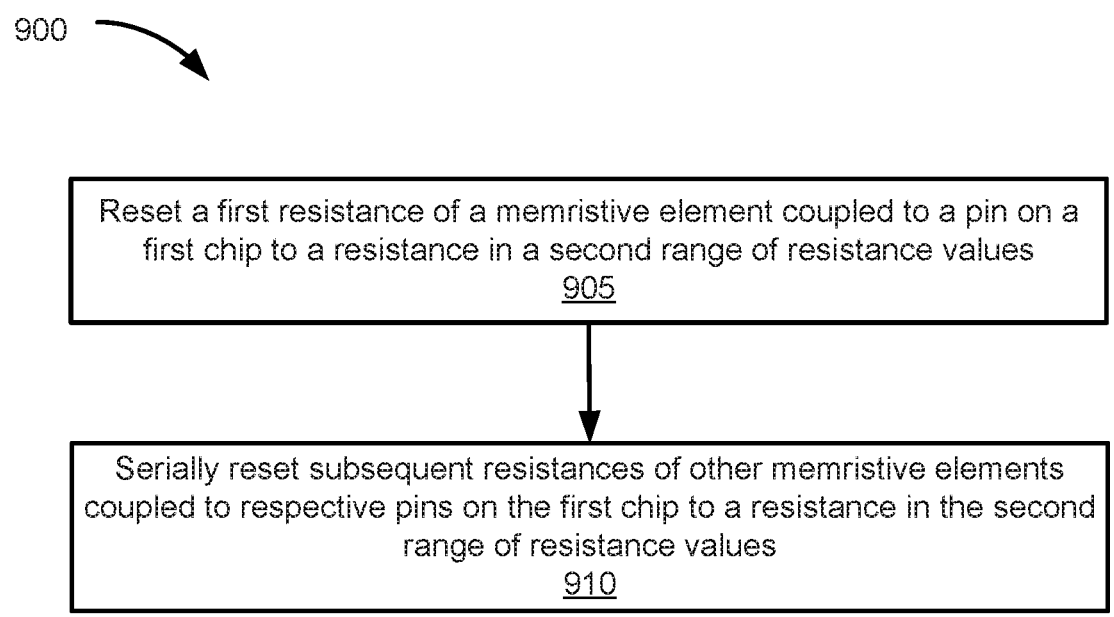
FIG. 9 depicts a flow diagram illustrating an example process of resetting multiple memristive elements that record ESD events on a chip.

FIG. 9 depicts a flow diagram illustrating an example process 900 of resetting multiple memristive elements that record ESD events on a chip.

At block 905, a first resistance in a first range of resistance values of a memristive element coupled to a pin on a first chip may be reset to a resistance in a second range of resistance values. In some implementations, the first range of resistance values may be less than the second range of resistance values.

At block 910, subsequent resistances of other memristive elements coupled to respective pins on the first chip to a resistance in the second range of resistance values may be serially reset. In some implementations, at block 910, resistances may be serially reset just for memristive elements that have changed resistance values in response to an ESD event.

FIG. 10 depicts a flow diagram illustrating an example process 1000 of resetting multiple memristive elements that record ESD events on multiple chips. The process begins at block 1005 which may be similar to block 905 described with respect to the process 900 of FIG. 9. Block 1010 may also be similar to block 910 of FIG. 9.

At block 1015, each memristive element coupled to a respective pin of a second chip may be serially reset to a resistance in the second range of resistance values.

Not all of the steps, or features presented above are used in each implementation of the presented techniques.

As used in the specification and claims herein, the singular forms "a," "an," and "the" include plural referents unless the context clearly dictates otherwise.

What is claimed is:

1. An apparatus comprising:
   a memristive element coupled to a pin of an integrated circuit, wherein the memristive element switches from a first resistance within a first range of resistance values to a second resistance within a second range of resistance values in response to an electrostatic discharge (ESD) event at the pin; and
   read circuitry coupled to the memristive element to determine whether a resistance of the memristive element is in the first or second range of resistance values, wherein the read circuitry includes a first transistor,
   wherein the coupling between the read circuitry and the memristive element does not include a direct path for current from the ESD event to a gate terminal of the first transistor, and wherein the coupling between the read circuitry and the memristive element includes a direct path for current from the ESD event to a dopant diffusion region of the first transistor.

2. The apparatus of claim 1, wherein the read circuitry comprises:
   a current source to provide a reference current;
   a current mirror to replicate the reference current to be passed through the memristive element; and
   a voltage comparator to compare a voltage drop across the memristive element to a reference voltage, wherein a determination of whether the resistance of the memristive element is in the first range of resistance values or the second range of resistance values is based on the voltage drop relative to the reference voltage.

3. The apparatus of claim 1, further comprising write circuitry coupled to the memristive element to set or reset the resistance of the memristive element to a particular resistance,
   wherein the write circuitry includes a second transistor, and
   further wherein the coupling between the write circuitry and the memristive element does not include a direct path for current from the ESD event to a gate terminal of the second transistor.

4. The apparatus of claim 3,
   wherein the memristive element has a first memristive terminal and a second memristive terminal,
   wherein the write circuitry includes a first write reset transistor having a first reset gate terminal, a first reset source terminal, and a first reset drain terminal; and a second write reset transistor having a second reset gate terminal, a second reset source terminal, and a second reset drain terminal,
   wherein the first reset gate terminal is coupled to a first voltage source, and the second reset gate terminal is coupled to a second voltage source,
   wherein the first memristive terminal is coupled to a first reset drain terminal,
   wherein the second memristive terminal is coupled to a second reset drain terminal, wherein the first reset source terminal is coupled to a third voltage source, wherein the second reset source terminal is coupled to ground, and wherein when the write circuitry is used to reset the resistance of the memristive element, current flows from the first reset source terminal, through the first write reset transistor to the first memristive terminal, through the memristive element to the second memristive terminal, through the second write reset transistor to the second reset source terminal coupled to ground.

5. The apparatus of claim 3, wherein the write circuitry includes a first write set transistor having a first set gate terminal, a first set source terminal, and a first set drain terminal; and a second write set transistor having a second set gate terminal, a second set source terminal, and a second set drain terminal, wherein the first set gate terminal is coupled to the first voltage source, and the second set gate terminal is coupled to the second voltage source, wherein the second memristive terminal is coupled to a first set drain terminal, wherein the first memristive terminal is coupled to a second set drain terminal, wherein the first set source terminal is coupled to the third voltage source, wherein the second set source terminal is coupled to ground, and wherein when the write circuitry is used to set the resistance of the memristive element, current flows from the first set source terminal, through the first write set transistor to the second memristive terminal; through the memristive element to the first memristive terminal, through the second write set transistor to the second set source terminal coupled to ground.

6. The apparatus of claim 1, further comprising shunting circuitry to shunt energy from an additional ESD event away from the memristive element, wherein an impedance of the read circuitry is greater than an impedance of the shunting circuitry.

7. The apparatus of claim 1, wherein the first range of resistance values is less than the second range of resistance values.

8. A method comprising:

determining a first resistance of a memristive element coupled to a pin on a first chip;

serially determining subsequent resistances of other memristive elements coupled to respective pins on the first chip, wherein each memristive element switches from a first resistance within a range of resistance values to a second resistance within a second range of resistance values in response to an electrostatic discharge (ESD) event at the respective pins.

9. The method of claim 8, wherein determining the first resistance of the memristive element and serially determining subsequent resistances of other memristive elements is performed using a serial test protocol.

10. The method of claim 8, further comprising setting a resistance of each memristive element to a resistance within the first range of resistance values if the resistance of a given memristive element is within the second range of resistance values.

11. The method of claim 8, further comprising:

serially determining additional resistances of additional memristive elements coupled to respective pins on a second chip.

12. The method of claim 11, further comprising:

serially setting a resistance of each memristive element on the first chip and the second chip to a resistance within the first range of resistance values if the resistance of a given memristive element is within the second range of resistance values.

13. A method comprising:

resetting a first resistance in a first range of resistance values of a memristive element coupled to a pin on a first chip to a resistance in a second range of resistance values;

serially resetting subsequent resistances of other memristive elements coupled to respective pins on the first chip to a resistance in the second range of resistance values, wherein each memristive element switches from a first resistance within a first range of resistance values to a second resistance within the second range of resistance values in response to an electrostatic discharge (ESD) event at the respective pin, and wherein the first range of resistance values is less than the second range of resistance values.

14. The method of claim 13, further comprising:

serially resetting each memristive element coupled to a respective pin of a second chip to a resistance in the second range of resistance values.

\* \* \* \* \*